(12) United States Patent
Matsuzawa (10) Patent No.: US 10,727,175 B2
(45) Date of Patent: Jul. 28, 2020

(54) ELECTRONIC COMPONENT-INCORPORATING SUBSTRATE AND SHEET SUBSTRATE

(71) Applicant: SHINKO ELECTRIC INDUSTRIES CO., LTD., Nagano-shi, Nagano-ken (JP)

(72) Inventor: Satoshi Matsuzawa, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 16/210,050

(22) Filed: Dec. 5, 2018

(65) Prior Publication Data

US 2019/0198432 A1    Jun. 27, 2019

(30) Foreign Application Priority Data

Dec. 25, 2017 (JP) .................. 2017-247790

(51) Int. Cl.
*H01L 23/498* (2006.01)
*H01L 21/48* (2006.01)
(Continued)

(52) U.S. Cl.
CPC ...... *H01L 23/49822* (2013.01); *H01L 21/486* (2013.01); *H01L 21/4853* (2013.01);
(Continued)

(58) Field of Classification Search
CPC ......... H01L 23/49822; H01L 23/49838; H01L 23/49833; H01L 23/49816; H01L 23/3114; H01L 23/3128; H01L 21/565; H01L 21/563; H01L 21/486; H01L 21/4853; H01L 24/83; H01L 24/81; H01L 24/13; H01L 2224/3204; H01L 2224/32145;
(Continued)

(56) References Cited

U.S. PATENT DOCUMENTS 8,106,495 B2 * 1/2012 Kajiki .................. H01L 21/565
257/678
2009/0008765 A1 1/2009 Yamano et al.
(Continued)

FOREIGN PATENT DOCUMENTS

WO      2007069606 A1      6/2007

*Primary Examiner* — Jasmine J Clark
(74) *Attorney, Agent, or Firm* — Tarolli, Sundheim, Covell & Tummino LLP (57) ABSTRACT

An electronic component-incorporating substrate includes a lower substrate, an electronic component mounted on the lower substrate, and an upper substrate arranged above the electronic component and the lower substrate. The substrate further includes a substrate connecting member arranged between the lower substrate and the upper substrate and an encapsulation resin filling a gap between the lower substrate and the upper substrate to encapsulate the electronic component and the substrate connecting member. The upper substrate includes a substrate body and a solder resist layer arranged on a lower surface of the substrate body. The solder resist layer includes a groove extending in the solder resist layer from a directly-above region, located directly above at least the electronic component, to a side surface of the upper substrate.

8 Claims, 9 Drawing Sheets

(51) Int. Cl.
*H01L 21/56* (2006.01)
*H01L 23/31* (2006.01)
*H01L 23/00* (2006.01)

(52) U.S. Cl.
CPC .......... *H01L 21/563* (2013.01); *H01L 21/565* (2013.01); *H01L 23/3114* (2013.01); *H01L 23/49816* (2013.01); *H01L 23/49833* (2013.01); *H01L 23/49838* (2013.01); *H01L 24/81* (2013.01); *H01L 24/83* (2013.01); *H01L 23/3128* (2013.01); *H01L 24/13* (2013.01); *H01L 2224/16237* (2013.01); *H01L 2224/32145* (2013.01); *H01L 2224/48227* (2013.01); *H01L 2224/73204* (2013.01)

(58) Field of Classification Search
CPC . H01L 2224/48227; H01L 2224/16237; H01L 21/4857; H01L 23/49827
See application file for complete search history.

(56) References Cited

U.S. PATENT DOCUMENTS

| | | | |
|---|---|---|---|
| 2011/0256662 A1 | 10/2011 | Yamano et al. | |
| 2012/0193789 A1* | 8/2012 | Hu | H01L 21/56 257/738 |
| 2014/0210109 A1* | 7/2014 | Tanaka | H01L 23/145 257/778 |
| 2014/0313681 A1 | 10/2014 | Yamano et al. | |
| 2016/0358858 A1 | 12/2016 | Yamano et al. | |
| 2017/0098633 A1* | 4/2017 | Kumar | H01L 25/105 |
| 2017/0365559 A1 | 12/2017 | Yamano et al. | |

\* cited by examiner

Fig.4A (Comparative Example)

Fig.4B (Comparative Example)

ELECTRONIC COMPONENT-INCORPORATING SUBSTRATE AND SHEET SUBSTRATE

CROSS-REFERENCE TO RELATED APPLICATION

This application is based upon and claims the benefit of priority from prior Japanese Patent Application No. 2017-247790, filed on Dec. 25, 2017, the entire contents of which are incorporated herein by reference.

FIELD

This disclosure relates to an electronic component-incorporating substrate and a sheet substrate.

BACKGROUND

To reduce the size or save the space of a substrate including an electronic component such as a semiconductor chip, there is a prior art substrate embedding an electronic component, which is called an electronic component-incorporating substrate. An electronic component-incorporating substrate includes a first substrate on which a semiconductor chip is mounted and a second substrate stacked on the first substrate via solder balls. The gap between the first substrate and the second substrate is encapsulated with a resin (refer to International Patent Publication No. 2007/069606).

SUMMARY

A substrate incorporating an electronic component may be reduced in thickness by narrowing the gap between a first substrate and a second substrate. However, when the gap is narrowed, a gap between a semiconductor chip and the second substrate may not be sufficiently filled with a resin. Thus, voids may be formed between the semiconductor chip and the second substrate. When a void is formed, the void may expand due to, for example, moisture absorption and cause separation of the resin from the vicinity of the void. This lowers the reliability of the electronic component-incorporating substrate.

One embodiment is an electronic component-incorporating substrate. The electronic component-incorporating substrate includes a lower substrate, an electronic component mounted on the lower substrate, an upper substrate arranged above the electronic component and the lower substrate, a substrate connecting member arranged between the lower substrate and the upper substrate to connect the lower substrate and the upper substrate, and an encapsulation resin filling a gap between the lower substrate and the upper substrate to encapsulate the electronic component and the substrate connecting member. The upper substrate includes a substrate body and a solder resist layer arranged on a lower surface of the substrate body. The solder resist layer includes a groove extending in the solder resist layer from a directly-above region, located directly above at least the electronic component, to a side surface of the upper substrate.

Another embodiment is a sheet substrate. The sheet substrate includes a plurality of electronic component-incorporating substrates and a cutting region of the sheet substrate. The cutting region is defined surrounding the plurality of electronic component-incorporating substrates and between adjacent ones of the plurality of electronic component-incorporating substrates. Each of the electronic component-incorporating substrates includes a lower substrate, an electronic component mounted on the lower substrate, an upper substrate arranged above the electronic component and the lower substrate, a substrate connecting member arranged between the lower substrate and the upper substrate to connect the lower substrate and the upper substrate, and an encapsulation resin filling a gap between the lower substrate and the upper substrate to encapsulate the electronic component and the substrate connecting member. The upper substrate includes a substrate body and a solder resist layer arranged on a lower surface of the substrate body. The solder resist layer includes a groove extending in the solder resist layer from a directly-above region, located directly above at least the electronic component, to the cutting region.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

One embodiment will now be described below. Elements may be enlarged in the drawings to facilitate understanding. The elements may not be drawn to the actual scale. The scale of an element may differ between drawings. In the cross-sectional views, hatching of some elements may be omitted to facilitate understanding.

Figure 1A:
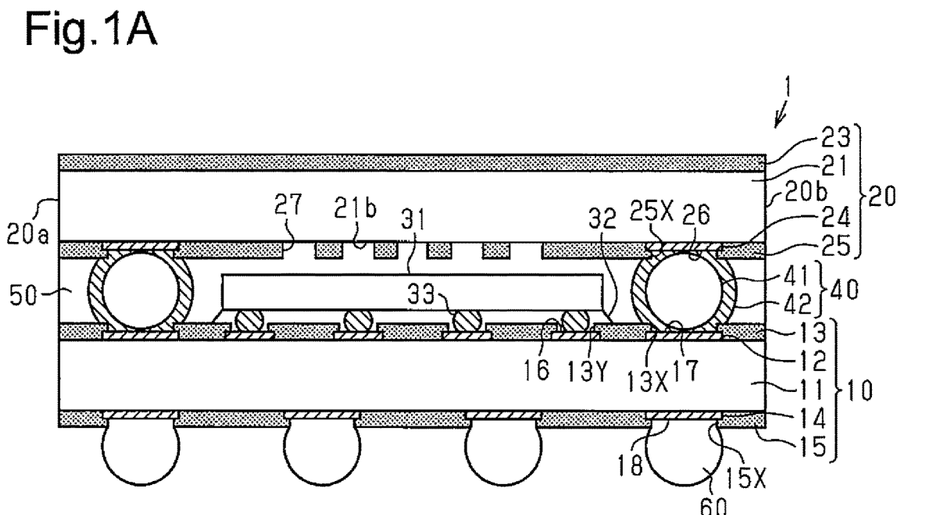
FIG. 1A is a schematic cross-sectional view illustrating an electronic component-incorporating substrate.

As illustrated in FIG. 1A, an electronic component-incorporating substrate 1 includes a lower substrate 10, an upper substrate 20, a semiconductor element 31, an underfill resin 32, substrate connecting members 40, and an encapsulation resin 50. The semiconductor element 31 is one example of an electronic component. In the electronic component-incorporating substrate 1, the upper substrate 20 is arranged on the lower substrate 10 via the substrate connecting members 40 electrically connecting the lower substrate 10 and the upper substrate 20.

The lower substrate 10 includes a substrate body 11, a wiring layer 12, a solder resist layer 13, a wiring layer 14, and a solder resist layer 15. The wiring layer 12 is arranged on the upper surface of the substrate body 11. The wiring layer 14 is arranged on the lower surface of the substrate body 11. The material of the wiring layers 12 and 14 may be, for example, copper (Cu).

As long as the substrate body 11 has a structure electrically connecting the wiring layer 12 to the wiring layer 14, the structure of the substrate body 11 is not particularly limited. The substrate body 11 may include an inner wiring layer but does not necessarily have to include an inner wiring layer. The substrate body 11 may include, for example, inner wiring layers and inter-layer insulation layers. Each of the inter-layer insulation layers is arranged between adjacent ones of the inner wiring layers. Via wirings formed in the inter-layer insulation layers and the inner wiring layers electrically connect the wiring layer 12 to the wiring layer 14. The material of the inner wiring layers and the via wirings may be, for example, copper or a copper alloy. The material of the inter-layer insulation layers may be, for example, an insulative resin such as an epoxy resin or a polyimide resin or a resin material in which the insulative resin is mixed with filler such as silica or alumina. The substrate body 11 may be, for example, a build-up core substrate, which includes a core substrate, or a coreless substrate, which does not include a core substrate. Alternatively, the substrate body 11 may be a silicon substrate or a ceramic substrate.

The solder resist layer 13 covers the upper surface of the substrate body 11 and part of the wiring layer 12. The solder resist layer 13 includes openings 13Y exposing part of the wiring layer 12 as pads 16 and openings 13X exposing part of the wiring layer 12 as connection pads 17. The material of the solder resist layer 13 may be, for example, an insulative resin such as an epoxy resin or an acrylic resin.

If necessary, an organic solderability preservative (OSP) process may be performed on the surface of the wiring layer 12 exposed from the openings 13X and 13Y to form an OSP film on the wiring layer 12. In this case, the semiconductor element 31 may be connected to the OSP film. Also, a metal layer may be formed on the wiring layer 12 exposed from the openings 13X and 13Y. In this case, the semiconductor element 31 may be connected to the metal layer. Examples of the metal layer include a gold (Au) layer, a nickel (Ni) layer/Au layer (metal layer in which Ni layer is formed on the wiring layer 12 and Au layer is formed on Ni layer), and a Ni layer/palladium (Pd) layer/Au layer (metal layer in which Ni layer is formed on the wiring layer 12 and Ni layer, Pd layer, and Au layer are sequentially formed). The Ni layer, the Au layer, and the Pd layer may be, for example, an electroless plating metal layer formed through electroless plating. The Au layer is a metal layer formed of Au or a Au alloy. The Ni layer is a metal layer formed of Ni or a Ni alloy. The Pd layer is a metal layer formed of Pd or a Pd alloy.

The pads 16 are connected to the semiconductor element 31 via bumps 33. Thus, the semiconductor element 31 is flip-chip-mounted on the lower substrate 10. The semiconductor element 31 may be, for example, a logic chip such as a central processing unit (CPU) chip or a graphics processing unit (GPU) chip. The semiconductor element 31 may be a memory chip such as a dynamic random access memory (DRAM) chip, a static random access memory (SRAM) chip, or a flash memory chip.

The bumps 33 may be bumps arranged on the pads 16, bumps arranged on pads of the semiconductor element 31, or both the bumps arranged on the pads 16 and the bumps arranged on pads of the semiconductor element 31. The bumps 33 may be, for example, gold bumps or solder bumps. The material of solder bumps may be, for example, an alloy containing lead (Pb), an alloy of tin (Sn) and Au, an alloy of Sn and Cu, an alloy of Sn and Ag, or an alloy of Sn, Ag, and Cu.

In the example illustrated in FIG. 1A, the semiconductor element 31 is mounted on the lower substrate 10. However, the electronic component is not limited to the semiconductor element 31. For example, a different electronic component such as a capacitor or an inductor may be mounted on the lower substrate 10. Multiple electronic components may be mounted on the lower substrate 10.

The gap between the upper surface of the lower substrate 10 and the semiconductor element 31 is filled with the underfill resin 32. The material of the underfill resin 32 may be, for example, an insulative resin such as an epoxy resin.

The solder resist layer 15 covers the lower surface of the substrate body 11 and part of the wiring layer 14. The solder resist layer 15 includes openings 15X exposing part of the wiring layer 14 as external connection pads 18. The material of the solder resist layer 15 may be, for example, an insulative resin such as an epoxy resin or an acrylic resin.

External connection terminals 60 are connected to the external connection pads 18 and used to mount the electronic component-incorporating substrate 1 on a mount board (not illustrated) such as a motherboard. The external connection terminals 60 are, for example, solder balls. Alternatively, the external connection terminals 60 connected to the external connection pads 18 may be solder bumps or lead pins.

If necessary, the OSP process may be performed on the surface of the wiring layer 14 exposed from the openings 15X in the solder resist layer 15 to form an OSP film on the wiring layer 14. In this case, the external connection terminals 60 may be connected to the OSP film. Also, a metal layer may be formed on the wiring layer 14 exposed from the openings 15X. In this case, the external connection terminals 60 may be connected to the metal layer. Examples of the metal layer include an Au layer, a Ni layer/Au layer (metal layer in which Ni layer is formed on surface of the wiring layer 14, and Au layer is formed on Ni layer), a Ni layer/Pd layer/Au layer (metal layer in which Ni layer is formed on surface of the wiring layer 14, and Ni layer, Pd layer, and Au layer are sequentially formed). The wiring layer 14 exposed from the openings 15X may be used as external connection terminals. Alternatively, the OSP film or metal layer formed on the wiring layer 14 may be used as external connection terminals.

The upper substrate 20 includes a substrate body 21, a solder resist layer 23, a wiring layer 24, and a solder resist layer 25. The solder resist layer 23 covers the upper surface of the substrate body 21. The material of the solder resist layer 23 may be, for example, an insulative resin such as an epoxy resin or an acrylic resin.

In the upper substrate 20, a wiring layer may be arranged on the upper surface of the substrate body 21. In this case, the solder resist layer 23 may include openings exposing part of the wiring layer as pads. Further, if necessary, an OSP film or a metal layer may be formed on the wiring layer exposed from the solder resist layer 23.

The wiring layer 24 is arranged on a lower surface 21b of the substrate body 21. The material of the wiring layer 24 may be, for example, copper (Cu).

The substrate body 21 may include an inner wiring layer but does not necessarily have to include an inner wiring layer. The substrate body 21 may include, for example, inner wiring layers and inter-layer insulation layers. Each of the inter-layer insulation layers is arranged between adjacent ones of the inner wiring layers. Via wirings formed in the inter-layer insulation layers electrically connect the inner wiring layers to the wiring layer 24. The material of the inner wiring layers and the via wirings may be, for example, copper or a copper alloy. The material of the inter-layer insulation layers may be, for example, an insulative resin such as an epoxy resin or a polyimide resin or a resin material in which the insulative resin is mixed with a filler such as silica or alumina. The substrate body 21 may be, for example, a build-up core substrate, which includes a core substrate, or a coreless substrate, which does not include a core substrate. Alternatively, a silicon substrate or a ceramic substrate may be used as the substrate body 21.

The solder resist layer 25 covers the lower surface 21b of the substrate body 21 and part of the wiring layer 24. The solder resist layer 25 includes openings 25X exposing part of the wiring layer 24 as connection pads 26 and discharge grooves 27. The structure of the discharge grooves 27 will be described later. The material of the solder resist layer 25 may be, for example, an insulative resin such as an epoxy resin or an acrylic resin.

If necessary, the OSP process may be performed on the surface of the wiring layer 24 exposed from the openings 25X in the solder resist layer 25 to form an OSP film on the wiring layer 24. Alternatively, a metal layer may be formed on the wiring layer 24 exposed from the openings 25X. Examples of the metal layer include a Au layer, a Ni layer/Au layer (metal layer in which Ni layer is formed on surface of the wiring layer 24, and Au layer is formed on Ni layer), and a Ni layer/Pd layer/Au layer (metal layer in which Ni layer is formed on surface of the wiring layer 24, and Ni layer, Pd layer, and Au layer are sequentially formed).

The connection pads 17 of the lower substrate 10 are connected to the connection pads 26 of the upper substrate 20 via the substrate connecting members 40.

The substrate connecting members 40 electrically connect the lower substrate 10 to the upper substrate 20. The substrate connecting members 40 set a given gap (separating distance) between the lower substrate 10 and the upper substrate 20.

For example, core solder balls may be used as the substrate connecting members 40. In this case, each of the substrate connecting members 40 includes a spherical core 41 and a solder 42 covering the peripheral surface of the core 41. The core 41 may be, for example, a metal core formed of a metal material such as Cu or a resin core formed of a resin material. The solder 42 may be formed of a solder material such as an alloy containing Pb, an alloy of Sn and Cu, an alloy of Sn and Sb, an ally of Sn and Ag, or an alloy of Sn, Ag, and Cu.

The substrate connecting members 40 are not limited to the core solder balls including the core 41 and the solder 42. For example, coreless solder balls may be used as the substrate connecting members 40. Alternatively, metal posts such as copper posts or metal bumps such as gold bumps may be used. When coreless solder balls are used, a jig may be used to set the gap between the lower substrate 10 and the upper substrate 20 during manufacturing of the electronic component-incorporating substrate 1.

The encapsulation resin 50 fills the gap between the lower substrate 10 and the upper substrate 20. The encapsulation resin 50 encapsulates the semiconductor element 31, the substrate connecting members 40, and the underfill resin 32. The encapsulation resin 50 fixes the upper substrate 20 to the lower substrate 10. The encapsulation resin 50 functions as an adhesive bonding the lower substrate 10 to the upper substrate 20. The encapsulation resin 50 also functions as a protection layer protecting the semiconductor element 31 and the substrate connecting members 40. Further, the encapsulation resin 50 increases the mechanical strength of the entire electronic component-incorporating substrate 1.

The material of the encapsulation resin 50 may be, for example, an insulative resin such as an epoxy resin or a polyimide resin. The material of the encapsulation resin 50 may be, for example, a resin material in which a filler such as silica is mixed with an insulative resin such as an epoxy resin or a polyimide resin. Other than silica, the filler may be, for example, an inorganic compound such as titanium oxide, aluminum oxide, aluminum nitride, silicon carbide, calcium titanate, or zeolite or an organic compound. Alternatively, the encapsulation resin 50 may be, for example, a mold resin formed through transfer molding, compression molding, or injection molding.

As illustrated in FIG. 1A, in the upper substrate 20, the discharge grooves 27 extend in the solder resist layer 25, which is covered with the encapsulation resin 50. In the example illustrated in FIG. 1A, the discharge grooves 27 extend through the solder resist layer 25 in the thickness-wise direction to expose the lower surface 21b of the substrate body 21. Alternatively, the depth of the discharge grooves 27 may be set to be less than the thickness of the solder resist layer 25 so that the lower surface 21b of the substrate body 21 is covered with a thin solder resist layer 25 in positions of the discharge grooves 27. Additionally, the discharge grooves 27 may expose the wiring layer 24, which is arranged on the lower surface 21b of the substrate body 21.

Figure 1B:
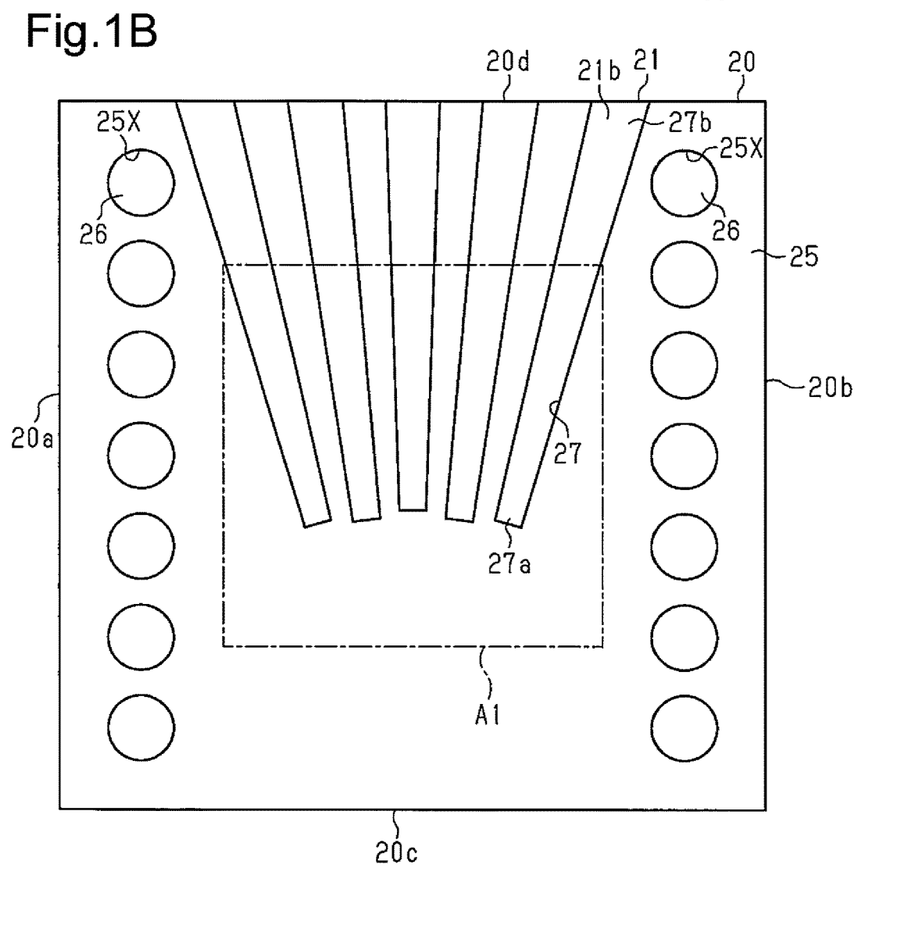
FIG. 1B is a schematic plan view of an upper substrate arranged on the electronic component-incorporating substrate illustrated in FIG. 1A.

As illustrated in FIG. 1B, the upper substrate 20 is rectangular. As indicated by the single-dashed lines in FIG. 1B, the upper substrate 20 (solder resist layer 25) includes a directly-above region A1 located directly above the semiconductor element 31 illustrated in FIG. 1A. In the solder resist layer 25, the openings 25X exposing the connection pads 26 are arranged at an outer side of the semiconductor element 31 (i.e., directly-above region A1) in a plan view.

The upper substrate 20 includes side surfaces 20a, 20b, 20c, and 20d. The side surfaces 20a and 20b correspond to a first pair of side surfaces opposed to each other. The side surfaces 20c and 20d correspond to a second pair of side surfaces opposed to each other. In the present embodiment, the openings 25X are arranged in a line along each of the side surfaces 20a and 20b of the upper substrate 20. The connection pads 26 are exposed in the openings 25X and connected to the substrate connecting members 40 illustrated in FIG. 1A.

The discharge grooves 27 extend in the solder resist layer 25 from the directly-above region A1, which is located directly above the semiconductor element 31, to one of the side surfaces 20a to 20d of the upper substrate 20. In the present embodiment, the discharge grooves 27 extend in a direction in which the openings 25X are arranged (in FIG. 1B, vertical direction) from the directly-above region A1 to one of the side surfaces 20c and 20d of the upper substrate 20 where the openings 25X are not arranged (in the example illustrated in FIG. 1B, side surface 20d).

In the present embodiment, each discharge groove 27 includes a first end 27a located in the directly-above region A1 and a second end 27b that is open in the side surface 20d of the upper substrate 20. The discharge groove 27 gradually widens from the first end 27a toward the second end 27b. The discharge grooves 27 radially spread from the directly-above region A1 toward the side surface 20d to allow a larger number of discharge grooves 27 to be arranged in the directly-above region A1.

The encapsulation resin 50 illustrated in FIG. 1A is formed using, for example, an encapsulation mold (not illustrated). For example, the lower substrate 10 on which the semiconductor element 31 is mounted and the upper substrate 20 connected to the lower substrate 10 via the substrate connecting members 40 are placed in the encapsulation mold, and a resin is injected into the encapsulation mold. At this time, the resin is injected into the gap between the lower substrate 10 and the upper substrate 20 from the side of the side surface 20c of the upper substrate 20 illustrated in FIG. 1B. Thus, in the discharge grooves 27, the narrow first ends 27a are located closest to the side where the resin is injected. Each discharge groove 27 gradually widens as the discharge groove 27 extends from the first end 27a to the second end 27b in a direction in which the resin is injected.

Figures 2A, 2B:
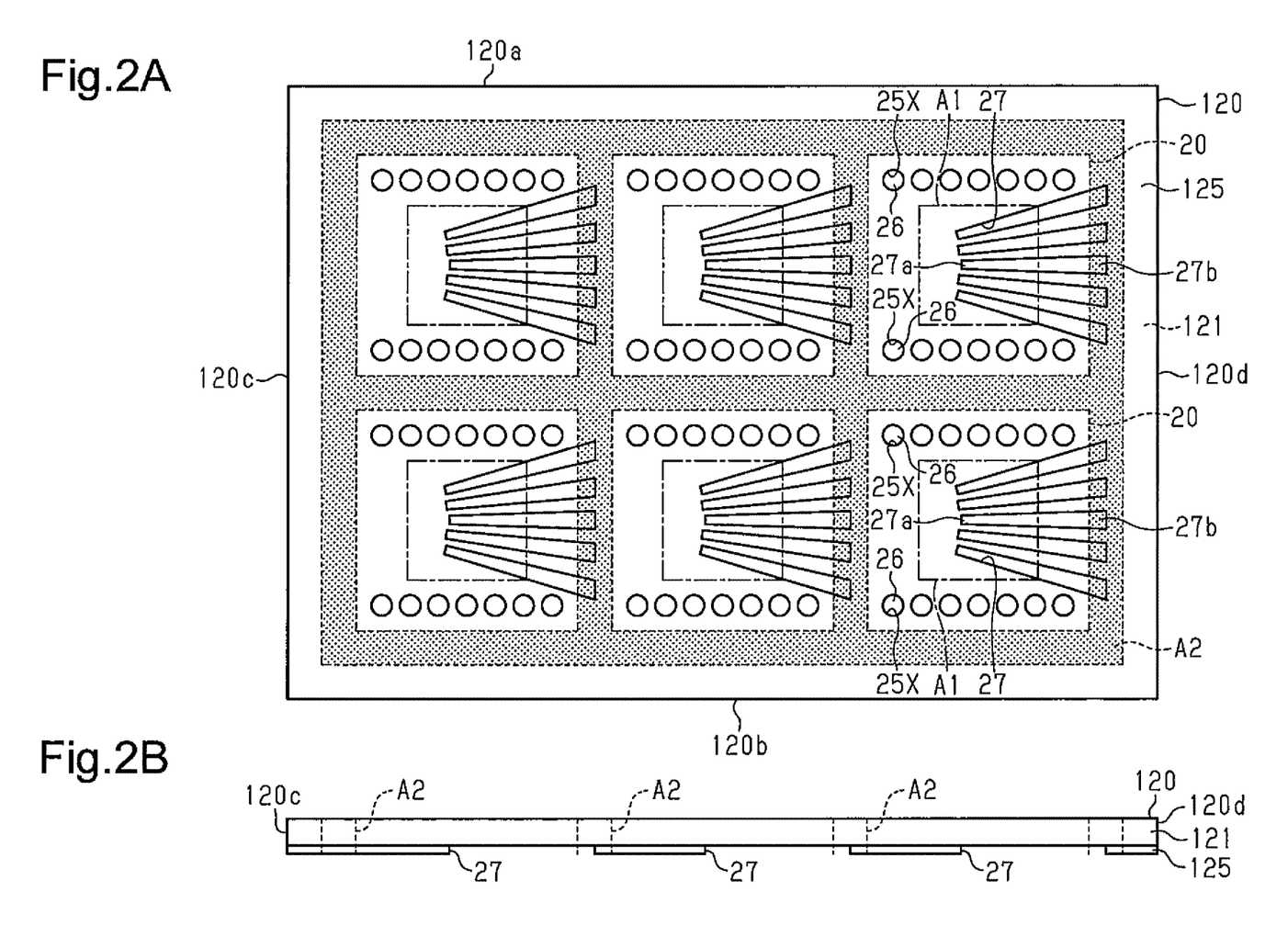
FIG. 2A is a schematic plan view of a work substrate including the upper substrate of FIG. 1B.
FIG. 2B is a schematic cross-sectional view of the work substrate illustrated in FIG. 2A.

FIGS. 2A and 2B illustrate a work substrate 120 including the upper substrates 20. In the description of FIGS. 2A and 2B, the same reference characters are given to those elements that are the same as the corresponding elements of the electronic component-incorporating substrate 1 illustrated in FIG. 1A.

The work substrate 120 is a large substrate including multiple regions that will be singulated as multiple upper substrates 20. In the example illustrated in FIG. 2A, the work substrate 120 includes six upper substrates 20.

The upper substrates 20 are arranged in the work substrate 120 in a matrix (in FIG. 2A, 2x3). The work substrate 120 includes cutting regions A2. In a sheet cutting process, the work substrate 120 is cut along the cutting regions A2 to singulate the six upper substrates 20. The cutting regions A2 are set to surround each upper substrate 20.

As illustrated in FIG. 2B, the work substrate 120 includes a substrate body 121 and a solder resist layer 125 arranged on the lower surface of the substrate body 121. The work substrate 120 further includes a wiring layer corresponding to the wiring layer 24 of the upper substrates 20 (refer to FIG. 1A) and a solder resist layer corresponding to the solder resist layer 23 of the upper substrates 20 (refer to FIG. 1A). However, FIG. 2B does not illustrate the wiring layer and the solder resist layer.

As illustrated in FIG. 2A, in each upper substrate 20 of the work substrate 120, the solder resist layer 125 includes the openings 25X exposing part of the wiring layer 24 (refer to FIG. 1A) as the connection pads 26 and the discharge grooves 27 extending from the directly-above region A1 to one of the side surfaces of the work substrate 120. In the work substrate 120, the discharge grooves 27 of each upper substrate 20 extend from the directly-above region A1 of the upper substrate 20 to the cutting region A2 located outside the upper substrate 20. The discharge grooves 27 and the openings 25X are formed, for example, through photolithography.

The work substrate 120 includes side surfaces 120a, 120b, 120c, and 120d. The side surfaces 120a and 120b correspond to a first pair of side surfaces opposed to each other. The side surfaces 120c and 120d correspond to a second pair of side surfaces opposed to each other. In the work substrate 120 of the present embodiment, the openings 25X are arranged parallel to the side surfaces 120a and 120b of the work substrate 120. In the work substrate 120, the connection pads 26 are exposed from the openings 25X.

As described referring to FIGS. 1A and 1B, the directly-above region A1 for each upper substrate 20 is located directly above an electronic component (e.g., semiconductor element 31 illustrated in FIG. 1A) incorporated in the corresponding electronic component-incorporating substrate 1. As illustrated in FIG. 2A, the discharge grooves 27 for each upper substrate 20 extend from the directly-above region A1 to the cutting region A2 beyond the corresponding upper substrate 20. In the example of FIG. 2A, the discharge grooves 27 for each upper substrate 20 extend in the arrangement direction of the openings 25X (sideward direction in FIG. 2A) from the directly-above region A1 toward the side surface 120d of the work substrate 120 where the openings 25X are not arranged (to cutting region A2 adjacent to the corresponding upper substrate 20). Thus, in the work substrate 120, the first end 27a of each discharge groove 27 is located in the directly-above region A1 of the corresponding upper substrate 20, and the second end 27b of each discharge groove 27 is located in the cutting region A2.

In the work substrate 120 of the present embodiment, each discharge groove 27 gradually widens from the first end 27a, which is located in the directly-above region A1, toward the second end 27b, which is located in the cutting region A2. In each upper substrate 20, the discharge grooves 27 radially spread from the directly-above region A1 toward the cutting region A2 to allow a larger number of discharge grooves 27 to be arranged in the directly-above region A1.

Figure 3A:
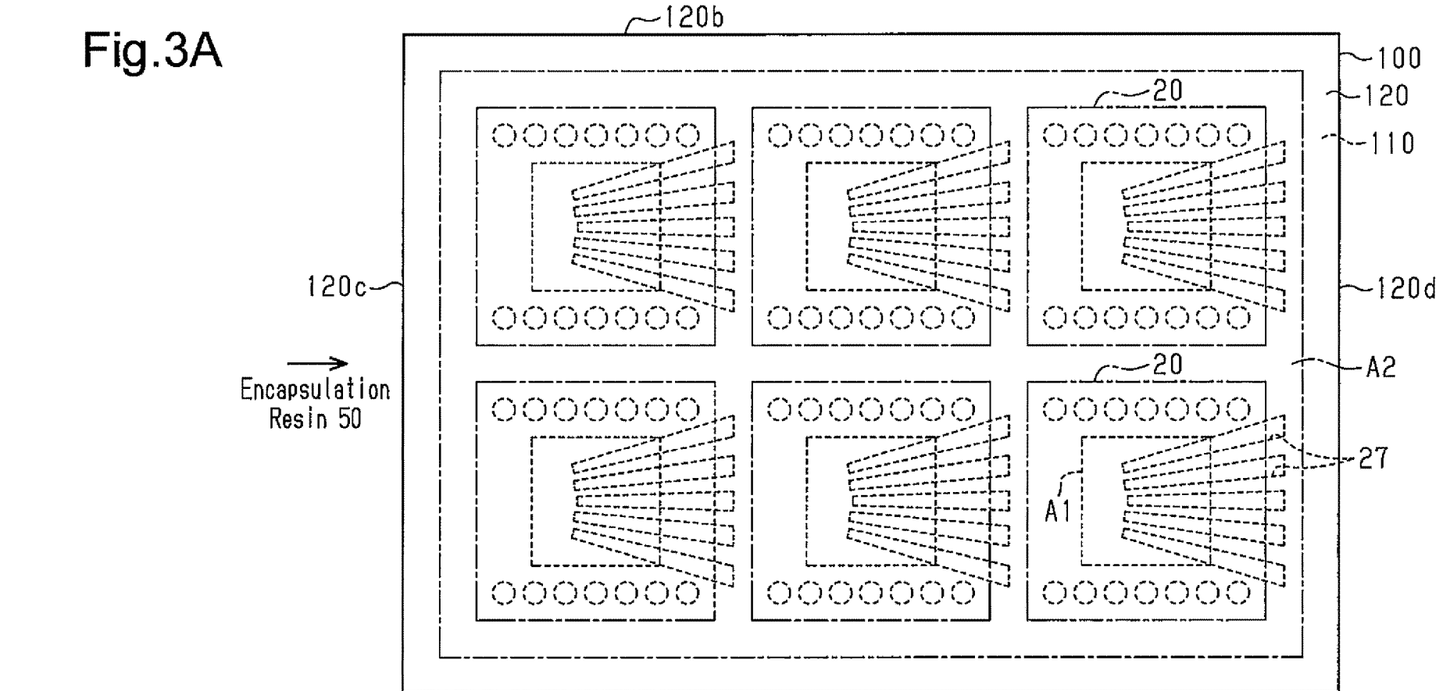
FIG. 3A is a schematic plan view of a sheet substrate after formation of an encapsulation resin.
Figure 3B:
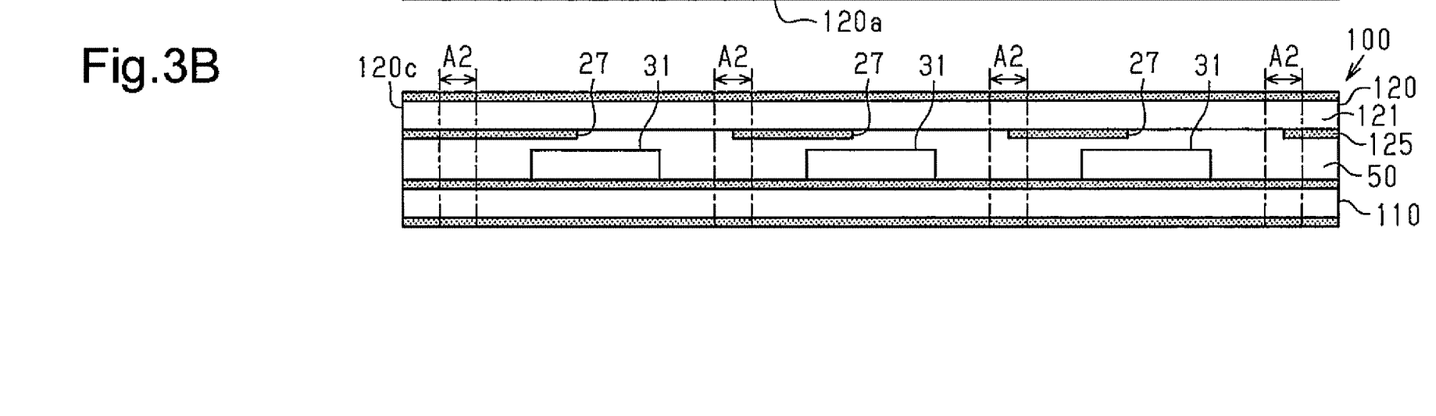
FIG. 3B is a schematic cross-sectional view of the sheet substrate illustrated in FIG. 3A.

FIGS. 3A and 3B illustrate a sheet substrate 100 that has not been cut. The sheet substrate 100 includes multiple (six, in FIG. 3A) electronic component-incorporating substrates 1 arranged in a matrix. In the description of FIGS. 3A and 3B, the same reference characters are given to those elements that are the same as the corresponding elements of the electronic component-incorporating substrate 1 illustrated in FIG. 1A. FIGS. 3A and 3B do not illustrate the underfill resin 32 and the bumps 33 connecting the semiconductor element 31, which are illustrated in FIG. 1A.

In the sheet substrate 100, the work substrate 120 illustrated in FIGS. 2A and 2B is connected by the substrate connecting members 40 illustrated in FIG. 1A to a work substrate 110 that includes the multiple (here, six) lower substrates 10 (refer to FIG. 1A). As illustrated in FIG. 3B, the semiconductor elements 31 are mounted on the upper surface of the work substrate 110 at locations corresponding to the lower substrates 10. The discharge grooves 27 for each upper substrate 20 formed in the solder resist layer 125 of the work substrate 120 extend from the directly-above region A1, which is located directly above the corresponding semiconductor element 31, to the cutting region A2. The encapsulation resin 50 is arranged between the work substrate 110 including the lower substrates 10 and the work substrate 120 including the upper substrates 20.

The encapsulation resin 50 is formed using, for example, an encapsulation mold (not illustrated). For example, the work substrate 110, on which the semiconductor elements 31 are mounted, and the work substrate 120, which is connected to the work substrate 110 by the substrate connecting members 40, are placed in the encapsulation mold. A resin is injected into the encapsulation mold. At this time, as illustrated in FIG. 3A, the resin is injected into the gap between the work substrate 110 and the work substrate 120 from the side of the side surface 120c of the work substrate 120. Thus, in the work substrate 120, the narrow first end 27a of each discharge groove 27 is located closest to the side where the resin is injected. Each discharge groove 27 gradually widens as the discharge groove 27 extends from the first end 27a to the second end 27b in a direction in which the resin is injected (in FIG. 3A, from left toward right).

In a sheet cutting process, the sheet substrate 100 including the encapsulation resin 50 is cut along the cutting regions A2. As a result, the electronic component-incorporating substrate 1 illustrated in FIG. 1A is obtained.

Figure 4A:
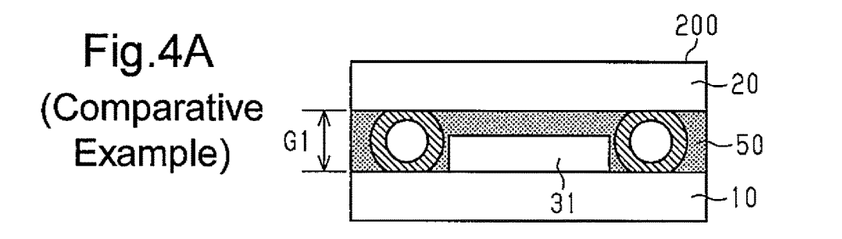
FIGS. 4A and 4B are schematic cross-sectional views illustrating various comparative examples of an electronic component-incorporating substrate.
Figure 4B:
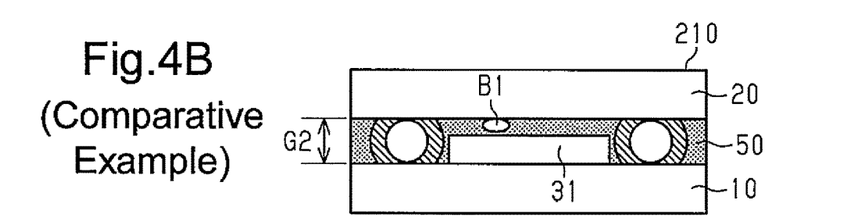

FIGS. 4A and 4B illustrate comparative examples of electronic component-incorporating substrates 200 and 210.

As illustrated in FIG. 4A, the electronic component-incorporating substrate 200 has a gap G1 between the lower substrate 10 and the upper substrate 20 that is set to a value sufficiently large enough for the encapsulation resin 50 to fill a gap between the semiconductor element 31 and the upper substrate 20. To reduce the size of the electronic component-incorporating substrate 200, the electronic component-incorporating substrate 210 illustrated in FIG. 4B has a gap G2 between the lower substrate 10 and the upper substrate 20 that is set to be smaller than the gap G1 in the electronic component-incorporating substrate 210 illustrated in FIG. 4A. However, the gap G2 of the electronic component-incorporating substrate 210 is so small that a gap between the semiconductor element 31 and the upper substrate 20 is not sufficiently filled with the encapsulation resin 50. As a result, a void B1 (air bubble) is formed at the lower surface of the upper substrate 20.

Figure 4C:
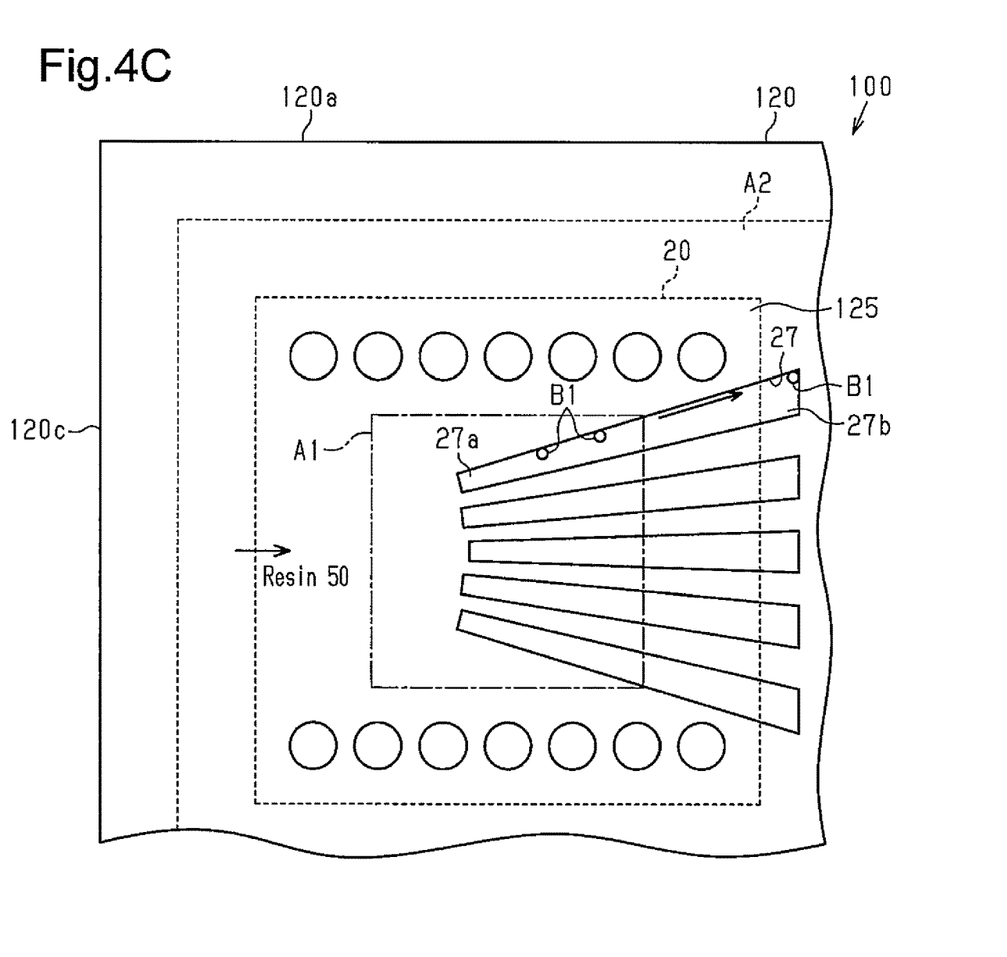
FIG. 4C is a schematic plan view illustrating the operation of the electronic component-incorporating substrate of FIG. 1A.

FIG. 4C illustrates part of the sheet substrate 100 illustrated in FIG. 3A. FIG. 4C is a view of the work substrate 120 including the upper substrates 20 taken from the solder resist layer 125. The encapsulation resin 50 is arranged in the gap between the work substrate 120 and the work substrate 110, which includes the lower substrates 10 as illustrated in FIG. 3B. The encapsulation resin 50 is injected into the encapsulation mold (not illustrated) from the left in FIG. 4C (side surface 20c of work substrate 120). At this time, in the same manner as the electronic component-incorporating substrate 210 illustrated in FIG. 4B, voids B1 may be formed. The voids B1 enter at the lower surface of the upper substrate 20, that is, a discharge groove 27 of the solder resist layer 125, and are moved in the discharge groove 27 by the injected encapsulation resin 50. The voids B1 stay in the second end 27b of the discharge groove 27 located in the cutting region A2. After the encapsulation resin 50 is cured, the sheet substrate 100 is cut along the cutting region A2 to singulate the electronic component-incorporating substrate 1. This obtains the electronic component-incorporating substrate 1 that limits the residue of the voids B1.

The present embodiment has the advantages described below.

(1) The electronic component-incorporating substrate 1 includes the lower substrate 10 and the upper substrate 20. The semiconductor element 31 is mounted on the lower substrate 10. The upper substrate 20 is arranged above the semiconductor element 31 and the lower substrate 10 and is connected to the lower substrate 10 via the substrate connecting members 40. The encapsulation resin 50 is arranged between the lower substrate 10 and the upper substrate 20 to encapsulate the semiconductor element 31 and the substrate connecting members 40. The upper substrate 20 includes the substrate body 21 and the solder resist layer 25 arranged on the lower surface 21b of the substrate body 21. The solder resist layer 25 includes the discharge grooves 27 extending from the directly-above region A1, which is located directly above at least the semiconductor element 31, to the side surface 20d of the upper substrate 20.

During formation of the encapsulation resin 50, voids B1 may be formed. The injected encapsulation resin 50 moves the voids B1 in the discharge grooves 27 from the directly-above region A1 toward the side surface 20d of the upper substrate 20. This obtains the electronic component-incorporating substrate 1 that limits the residue of the voids B1. The voids B1 cause separation of the resin from the vicinity of the voids B1 and lower the reliability of the electronic component-incorporating substrate 1. In this regard, the electronic component-incorporating substrate 1 of the present embodiment limits the residue of the voids B1 and will not lower the reliability.

(2) Each discharge groove 27 gradually widens from the first end 27a, which is located in the directly-above region A1 located directly above the semiconductor element 31, toward the second end 27b, which is open in the side surface 20d. Thus, even when voids B1 are formed in a process for forming the encapsulation resin 50, the wide second ends 27b arranged in the cutting regions A2 can accommodate a larger number of voids B1. This limits the residue of the voids B1 in the encapsulation resin 50 when the electronic component-incorporating substrate 1 is singulated.

(3) The voids B1 tend to be formed in the encapsulation resin 50 in a region between the semiconductor element 31 and the upper substrate 20. Taking this into consideration, the discharge grooves 27 radially spread from the directly-above region A1 toward the side surface 20d to allow a larger number of discharge grooves 27 to be arranged in the directly-above region A1 located directly above the semiconductor element 31. This allows the voids B1 to be further easily discharged through a large number of the discharge grooves 27 arranged in the directly-above region A1.

It should be apparent to those skilled in the art that the foregoing embodiments may be implemented in many other specific forms without departing from the scope of this disclosure. Particularly, it should be understood that the foregoing embodiments may be implemented in the following forms.

In the above embodiment, the structure of the upper substrate 20 and the number or shape of the discharge grooves 27 may be changed.

Figure 5:
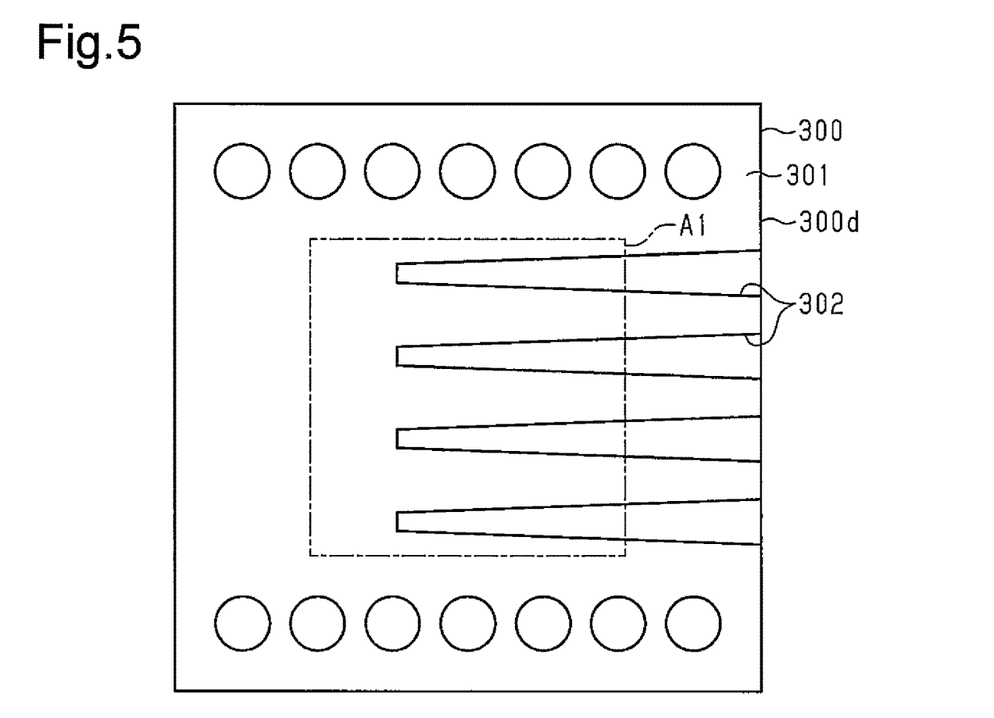
FIG. 5 is a schematic plan view illustrating a modified example of an upper substrate.
Figure 6:
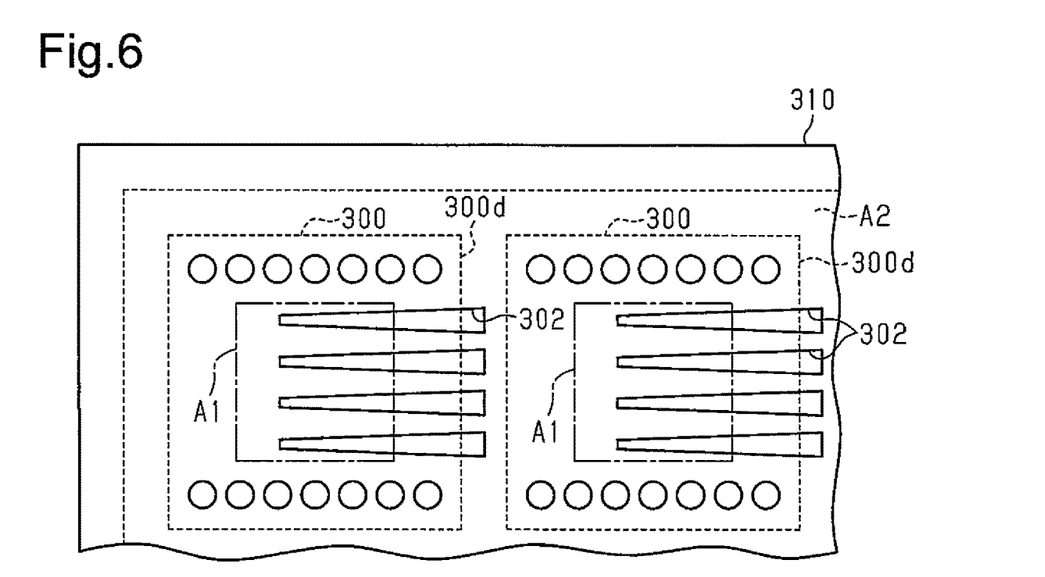
FIG. 6 is a schematic plan view illustrating part of a work substrate including the upper substrate of FIG. 5.

FIG. 5 illustrates a modified example of an upper substrate 300. FIG. 6 illustrates part of a work substrate 310 including the upper substrate 300 illustrated in FIG. 5. The upper substrate 300 includes a solder resist layer 301 including multiple (for example, four) discharge grooves 302. The discharge grooves 302 extend from the directly-above region A1 to a side surface 300d of the upper substrate 300 and are arranged parallel to each other. Each discharge groove 302 gradually widens from the directly-above region A1 toward the side surface 300d.

Figure 7:
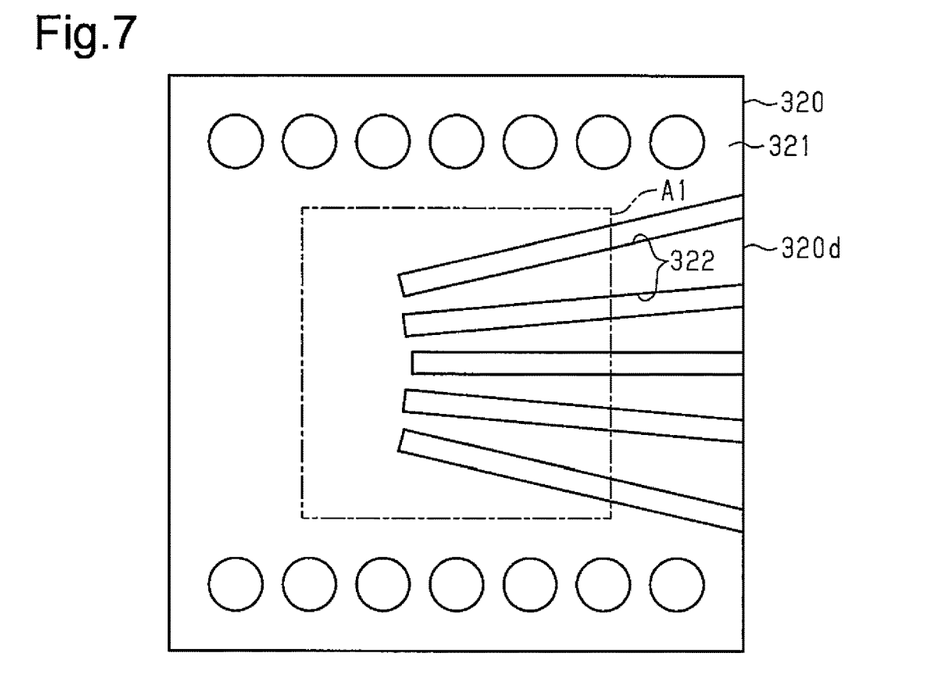
FIGS. 7 to 9 are schematic plan views illustrating various modified examples of an upper substrate.

FIG. 7 illustrates another modified example of an upper substrate 320. The upper substrate 320 includes a solder resist layer 321 including multiple (for example, five) discharge grooves 322. In the same manner as the above embodiment, the discharge grooves 322 are radially arranged from the directly-above region A1 toward the side surface 320d of the upper substrate 320. Each discharge groove 322 has a constant width throughout its full length.

Figure 8:
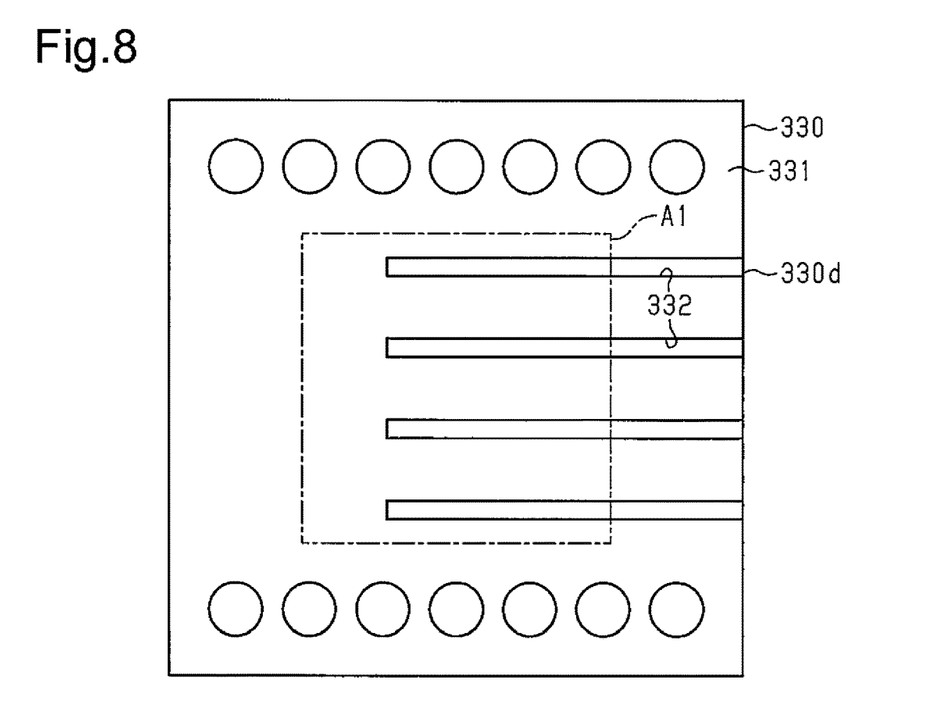

FIG. 8 illustrates another modified example of an upper substrate 330. The upper substrate 330 includes a solder resist layer 331 including multiple (for example, four) discharge grooves 332. The discharge grooves 332 extend from the directly-above region A1 to a side surface 330d of the upper substrate 330 and are arranged parallel to each other. Each discharge groove 332 has a constant width throughout its full length.

Figure 9:
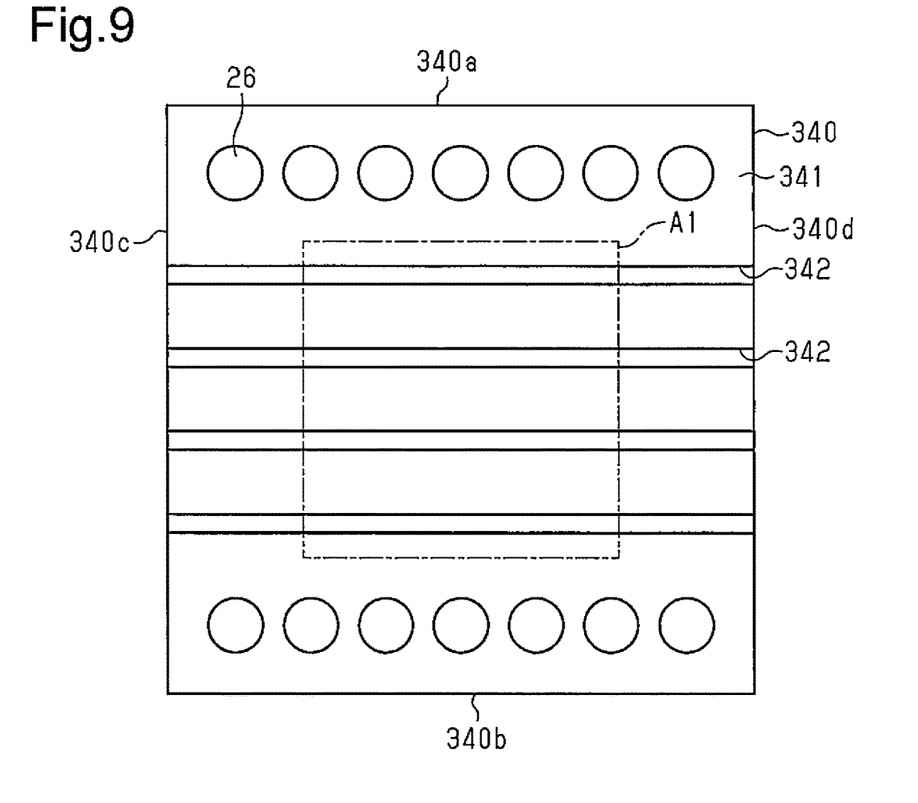

FIG. 9 illustrates another modified example of an upper substrate 340. The upper substrate 340 includes a solder resist layer 341 including multiple (for example, four) discharge grooves 342. The upper substrate 340 includes side surfaces 340a to 340d. The side surfaces 340a and 340b correspond to a first pair of side surfaces opposed to each other. The side surfaces 340c and 340d correspond to a second pair of side surfaces opposed to each other. The connection pads 26 (i.e., substrate connecting members 40 connected thereto) are arranged in a line along each of the side surfaces 340a and 340b. The discharge grooves 342 extend from one of the side surfaces 340c and 340d to the other of the side surfaces 340c and 340d through the directly-above region A1. Further, the discharge grooves 342 are arranged parallel to each other. Each discharge groove 342 has a constant width throughout its full length.

Figure 10:
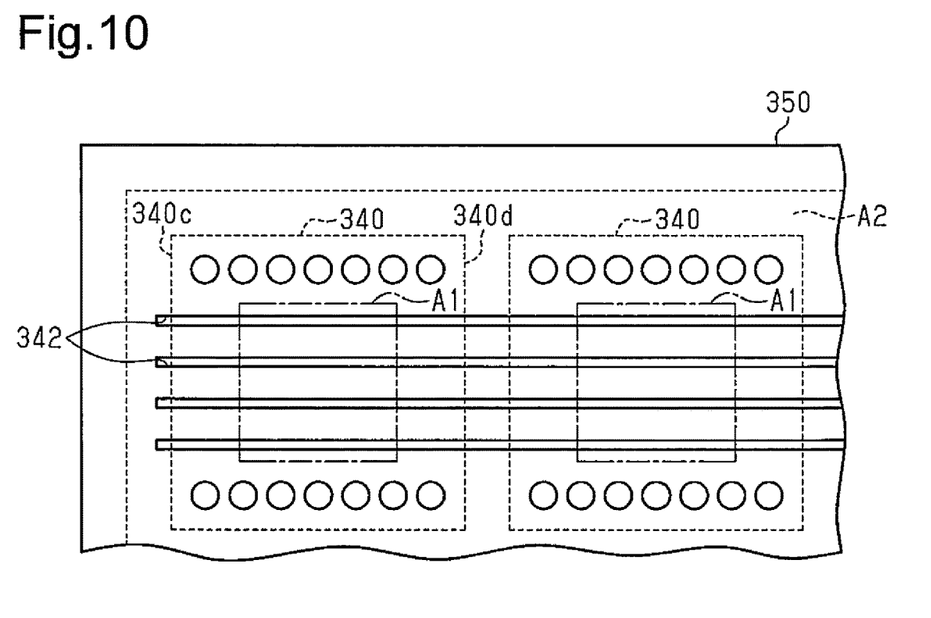
FIG. 10 is a schematic plan view illustrating part of a work substrate including the upper substrate of FIG. 9.

FIG. 10 illustrates part of a work substrate 350 including the upper substrate 340 illustrated in FIG. 9. In the work substrate 350, each discharge groove 342 continues through the upper substrates 340 that are arranged in the same line. Two ends of the discharge groove 342 are located in the cutting regions A2 adjacent to the two upper substrates 340 located at opposite sides of the line. Thus, the first end of each discharge groove 342 is located in the cutting region A2 that is located beyond the left edge (position of side surface 340c) of the upper substrate 340 located at the left side of the line. Also, although not illustrated in the drawings, the second end of each discharge groove 342 is located in the cutting region A2 that is located beyond the right edge (position of side surface 340d) of the upper substrate 340 located at the right side of the line.

Figure 11:
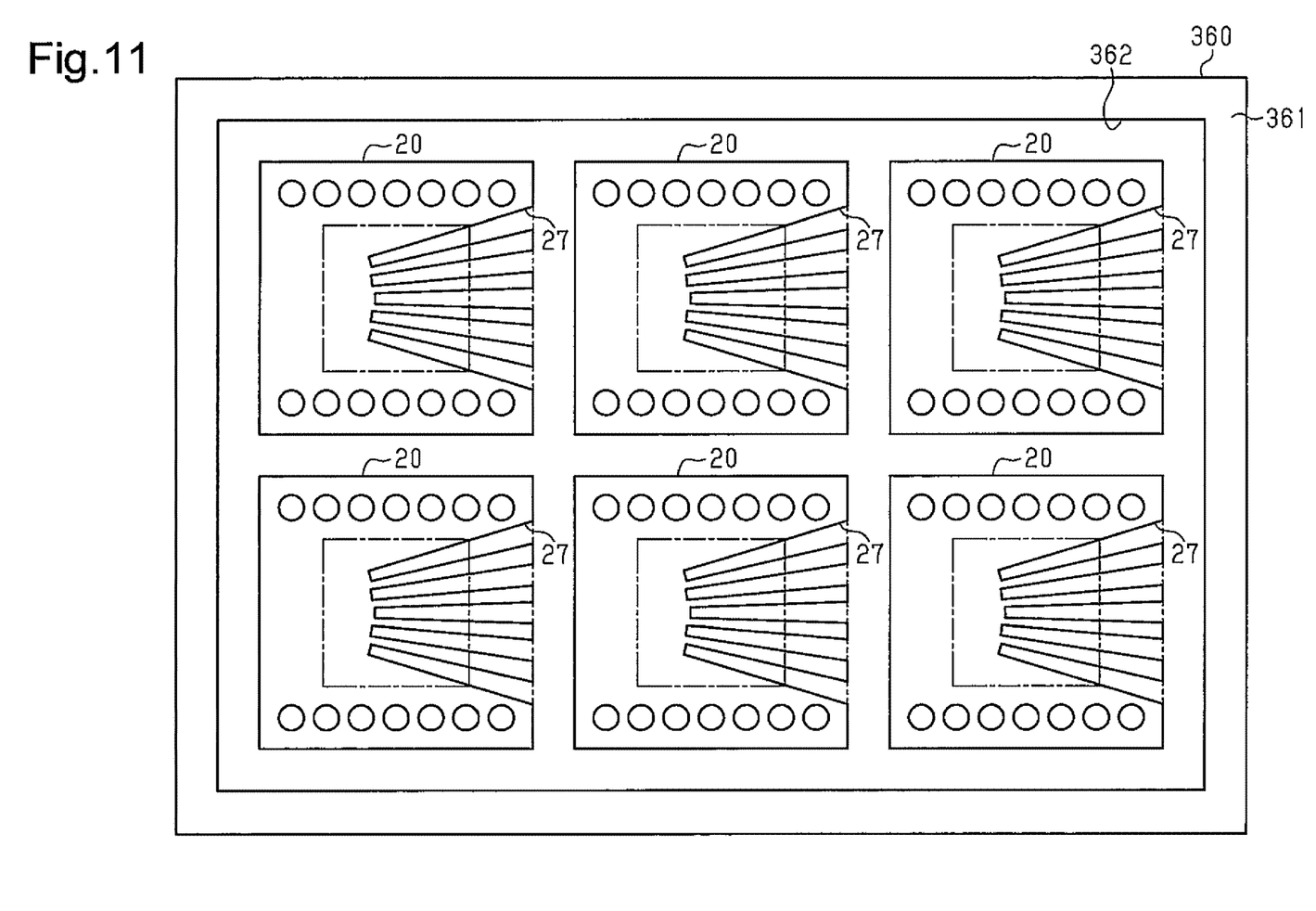
FIG. 11 is a schematic cross-sectional view illustrating a modified example of a work substrate.

FIG. 11 illustrates a modified example of a work substrate 360. The work substrate 360 may be used to form, for example, the upper substrate 20 illustrated in FIG. 1A. The work substrate 360 includes a solder resist layer 361 instead of the solder resist layer 125 illustrated in FIG. 2A. The solder resist layer 361 includes a looped groove 362 formed in the cutting regions A2 around the upper substrates 20. The groove 362 is continuous with (connected to) the discharge grooves 27 of each upper substrate 20.

Figure 12:
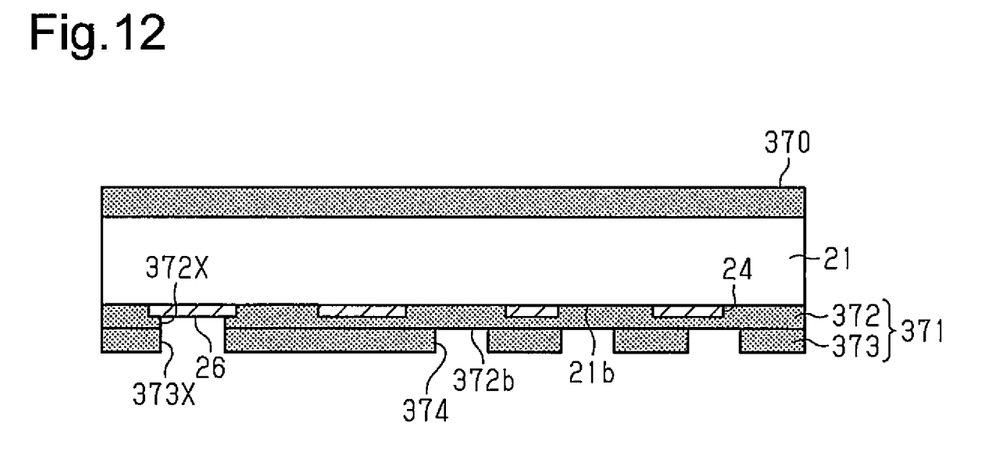
FIG. 12 is a schematic cross-sectional view illustrating a modified example of an upper substrate.

In the above embodiment, the solder resist layer 25 is formed of a single solder resist layer. Instead, the solder resist layer 25 may be formed of multiple solder resist layers. In this case, some of the solder resist layers may include discharge grooves. FIG. 12 illustrates a modified example of an upper substrate 370.

As illustrated in FIG. 12, the upper substrate 370 includes a solder resist layer 371 instead of the solder resist layer 25. The solder resist layer 371 includes a first solder resist layer 372 covering the lower surface 21b of the substrate body 21 and part of the wiring layer 24 and a second solder resist layer 373 covering part of the first solder resist layer 372. The first solder resist layer 372 includes an opening 372X exposing part of the wiring layer 24 as a connection pad 26. The second solder resist layer 373 includes an opening 373X connected to the opening 372X and exposing the connection pad 26. Additionally, the second solder resist layer 373 includes multiple discharge grooves 374 exposing part of the lower surface 372b of the first solder resist layer 372.

In the above embodiment, the sheet substrate 100 includes multiple electronic component-incorporating substrates 1 arranged in a matrix. Instead, the sheet substrate 100 may include multiple electronic component-incorporating substrates 1 that are arranged in a line.

The shape of the connection pads 26 (openings 25X) is not limited to the shape described in the above embodiment. For example, the connection pads 26 (openings 25X) may be tetragonal.

The arrangement of the connection pads 26 is not limited to the arrangement of the above embodiment. For example, the connection pads 26 (openings 25X) may be arranged in multiple lines along the side surfaces 20a and 20b of the upper substrate 20 (or any other side surfaces). Alternatively, the connection pads 26 (openings 25X) may be arranged around the semiconductor element 31 (i.e., along the side surfaces 20a to 20d of the upper substrate 20).

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. An electronic component-incorporating substrate, comprising:
   a lower substrate of the electronic component-incorporating substrate;
   an electronic component mounted on the lower substrate;
   an upper substrate of the electronic component-incorporating substrate, the upper substrate being arranged above the electronic component and the lower substrate;
   a substrate connecting member arranged between the lower substrate and the upper substrate to connect the lower substrate and the upper substrate; and
   an encapsulation resin filling a gap between the lower substrate and the upper substrate to encapsulate the electronic component and the substrate connecting member, wherein
   the upper substrate includes a substrate body and a solder resist layer arranged on a lower surface of the substrate body, and
   the solder resist layer includes a groove extending in the solder resist layer from a directly-above region, located directly above at least the electronic component, to a side surface of the upper substrate.

2. The electronic component-incorporating substrate according to claim 1, wherein
   the upper substrate includes a first pair of side surfaces opposed to each other and a second pair of side surfaces opposed to each other,
   the substrate connecting member is one of a plurality of substrate connecting members that are arranged along the first pair of side surfaces, and the groove extends in the solder resist layer from the directly-above region to one of the second pair of side surfaces.

3. The electronic component-incorporating substrate according to claim 1, wherein
the groove includes a first end located in the directly-above region and a second end that is open in the side surface of the upper substrate, and
the groove gradually widens from the first end toward the second end.

4. The electronic component-incorporating substrate according to claim 1, wherein
the groove includes a first end located in the directly-above region and a second end that is open in the side surface of the upper substrate, and
the groove has a width that is constant from the first end to the second end.

5. The electronic component-incorporating substrate according to claim 1, wherein
the groove is one of a plurality of grooves extending in the solder resist layer, the plurality of grooves being spaced apart from each other at an interval, and
the interval gradually widens from the directly-above region toward the side surface of the upper substrate.

6. The electronic component-incorporating substrate according to claim 1, wherein
the upper substrate includes a first pair of side surfaces opposed to each other and a second pair of side surfaces opposed to each other,
the substrate connecting member is one of a plurality of substrate connecting members that are arranged along the first pair of side surfaces, and
the groove extends in the solder resist layer from one of the second pair of side surfaces to the other of the second pair of side surfaces through the directly-above region.

7. The electronic component-incorporating substrate according to claim 1, wherein
the solder resist layer is formed of a plurality of solder resist layers, and
the groove is formed in a lowermost one of the plurality of solder resist layers.

8. A sheet substrate, comprising:
a plurality of electronic component-incorporating substrates; and
a cutting region of the sheet substrate, the cutting region being defined surrounding the plurality of electronic component-incorporating substrates and between adjacent ones of the plurality of electronic component-incorporating substrates, wherein
each of the electronic component-incorporating substrates includes
a lower substrate of the electronic component-incorporating substrate,
an electronic component mounted on the lower substrate,
an upper substrate of the electronic component-incorporating substrate, the upper substrate being arranged above the electronic component and the lower substrate,
a substrate connecting member arranged between the lower substrate and the upper substrate to connect the lower substrate and the upper substrate, and
an encapsulation resin filling a gap between the lower substrate and the upper substrate to encapsulate the electronic component and the substrate connecting member, wherein
the upper substrate includes a substrate body and a solder resist layer arranged on a lower surface of the substrate body, and
the solder resist layer includes a groove extending in the solder resist layer from a directly-above region, located directly above at least the electronic component, to the cutting region.

* * * * *